US007874056B2

(12) United States Patent
Campbell

(10) Patent No.: US 7,874,056 B2
(45) Date of Patent: Jan. 25, 2011

(54) METHOD OF CONTROLLING DELIVERY OF COMPONENTS TO AN ASSEMBLER

(75) Inventor: Gordon H. Campbell, Lawrenceville, GA (US)

(73) Assignee: Box Partition Technologies, Inc., Kutztown, PA (US)

(*) Notice: Subject to any disclaimer, the term of this patent is extended or adjusted under 35 U.S.C. 154(b) by 275 days.

(21) Appl. No.: 12/202,705

(22) Filed: Sep. 2, 2008

(65) Prior Publication Data
US 2008/0313877 A1 Dec. 25, 2008

Related U.S. Application Data

(62) Division of application No. 11/415,561, filed on May 2, 2006, now Pat. No. 7,624,557.

(51) Int. Cl.
*B23Q 15/00* (2006.01)
*B65B 1/04* (2006.01)

(52) U.S. Cl. .................... 29/407.01; 29/407.05; 29/709; 29/712; 29/714; 53/263

(58) Field of Classification Search ............. 29/407.01, 29/407.04, 407.05, 407.09, 407.1, 703, 709, 29/712, 714; 53/263, 139.5, 157, 474; 493/90, 493/91, 92; 700/95, 117
See application file for complete search history.

(56) References Cited

U.S. PATENT DOCUMENTS

| 3,133,481 | A | 5/1964 | McCormick |
| 3,350,836 | A | 11/1967 | Dillon et al. |
| 3,473,295 | A | 10/1969 | Nigrelli et al. |
| 3,626,818 | A | 12/1971 | Anson |
| 3,651,614 | A | 3/1972 | Corderoy |
| 3,678,647 | A | 7/1972 | Corderoy |
| 3,760,557 | A | 9/1973 | McIntyre |
| 3,780,627 | A | 12/1973 | Roda |
| 3,803,993 | A | 4/1974 | Graham et al. |
| 3,945,780 | A | 3/1976 | Marcel |
| 4,019,427 | A | 4/1977 | Down et al. |
| 4,154,148 | A | 5/1979 | Weremiczyk et al. |
| 4,292,034 | A | 9/1981 | Probyn et al. |
| 4,962,625 | A | 10/1990 | Johnson et al. |
| 4,996,821 | A | 3/1991 | Crowe et al. |
| 7,302,785 | B2 | 12/2007 | Heuvel et al. |

OTHER PUBLICATIONS

Tawfik, Sameh H., "First Office Action", U.S. Appl. No. 12/202,684, filed Sep. 2, 2008, Gordon H. Campbell, first inventor, mailed Oct. 28, 2010., Note that the reference relied upon was cited in the parent case. However, the language used in the rejection is slightly different. Being cited per the holding in *McKesson Info. Solutions v. Bridge Medical*, 2006 WL 1652518 (E.D. Cal. Jun. 13, 2006).

*Primary Examiner*—Jermie E Cozart
(74) *Attorney, Agent, or Firm*—Philip H. Burrus, IV

(57) ABSTRACT

An assembling machine with a feeder is provided. The feeder feeds receiving components into an assembler, where a moveable coupling mechanism couples attaching components to the receiving components. Transporting mechanisms coupled to a plurality of drive trains deliver the receiving components across the feeder table and to the assembler. The transporting mechanisms alternate between a plurality of speeds so as to deliver the receiving components to the assembler such that the moveable coupling mechanism may operate at a continuous, periodic rate.

20 Claims, 8 Drawing Sheets

METHOD OF CONTROLLING DELIVERY OF COMPONENTS TO AN ASSEMBLER

CROSS REFERENCE TO PRIOR APPLICATIONS

This application is a divisional application under 35 USC §121 of U.S. application Ser. No. 11/415,561, filed May 2, 2006, now U.S. Pat. No. 7,624,557 B2 which is incorporated by reference for all purposes.

BACKGROUND

1. Technical Field

This invention relates generally to an assembling machine having an assembler that couples a first component to a second component, and more specifically to an assembling machine, for example a partition insertion machine, having a moving assembler, where a feeder is capable of feeding components to the assembler such that the moving assembler may operate in a continuous periodic motion.

2. Background Art

The assembly of components has long been automated. From assembling envelopes to automobiles, most repetitive work in factories today is accomplished by machines. In many factories, a conveyor belt feeds unfinished components to a task-performing machine. Upon receiving the unfinished component, the task-performing machine executes its programmed function. The machine then waits as the conveyor belt moves the completed component down the line. When a new unfinished component reaches the machine, the programmed task is executed again. This process continues, with the machine working and waiting, for as long as the line is operational.

By way of example, consider a machine for assembling packaging partitions. When viewed in cross section, these partitions—which are often made of cardboard and separate items or components in a box to prevent them from touching—often resemble a multi-celled tic-tac-toe board made of vertical components inserted into horizontal components. A machine performs the step of insertion. By way of example, a worker may deliver a set of vertical components to the assembler. With a rat-tat-tat motion, the assembler inserts the horizontal components into the vertical components. The assembler then stops, to allow the worker to clear the completed partition assembly from the assembler. The assembler waits for another set of vertical components to be delivered. Once the vertical components are in place, the assembler again attaches the horizontal components.

There are two problems with such partition assemblers: first, they are expensive and inefficient to operate. A worker must deliver parts to the assembler, activate it, stop it, and then remove the assembly. Second, stopping and starting the machine causes wear and tear. This is because the majority of wear and tear on automated machines occurs not when they are running, but when they are stopped and restarted.

There is thus a need for an improved assembly machine that is more efficient.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
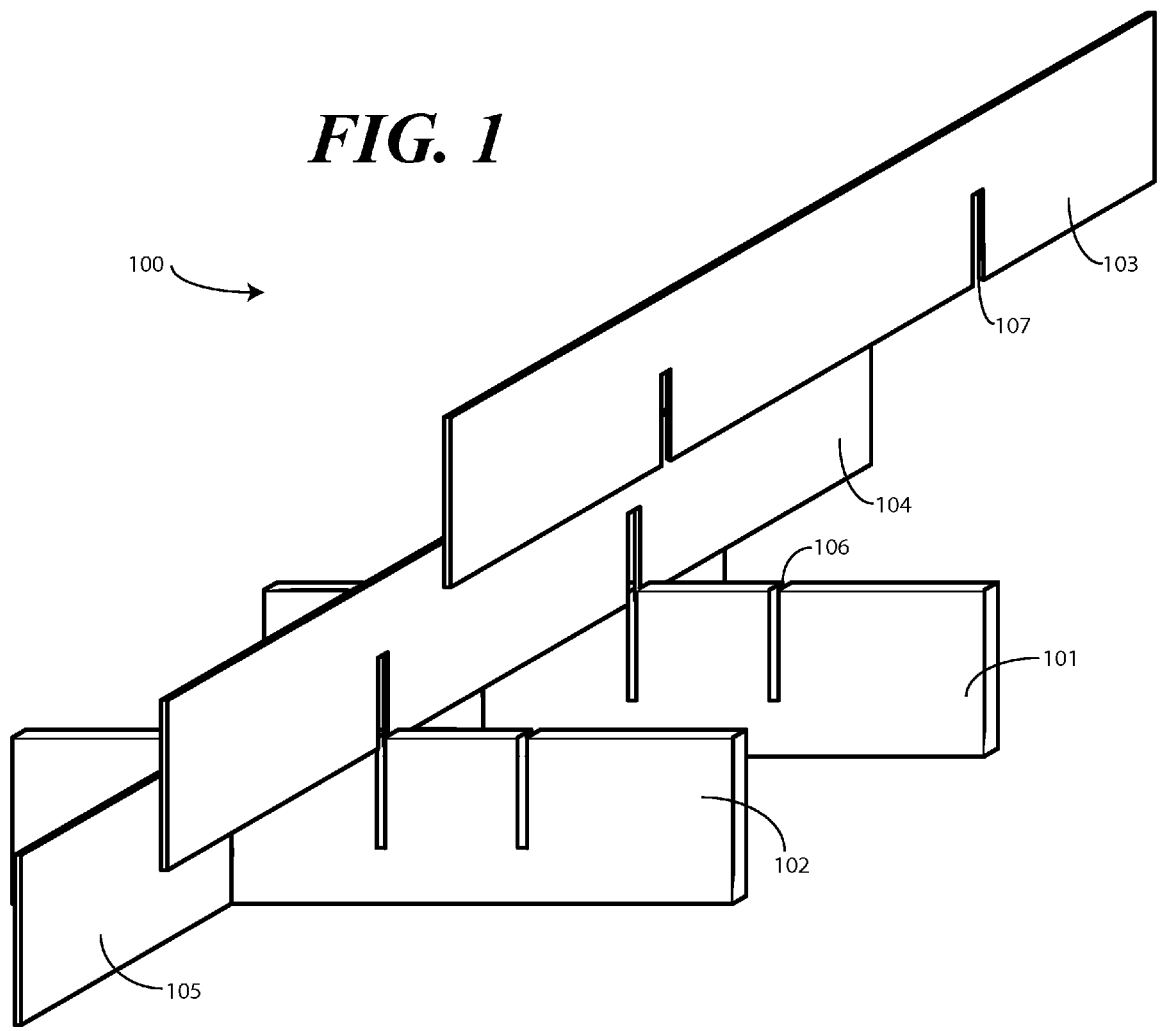
FIG. 1 illustrates a perspective view of one example of a semi-assembled partition suitable for assembly with a machine in accordance with the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to automatically assembling components by way of an assembly machine. The apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

Embodiments of the invention are now described in detail. Referring to the drawings, like numbers indicate like parts throughout the views. Relational terms such as first and second, top and bottom, and the like may be used solely to distinguish one entity or action from another entity or action without necessarily requiring or implying any actual such relationship or order between such entities or actions. As used in the description herein and throughout the claims, the following terms take the meanings explicitly associated herein, unless the context clearly dictates otherwise: the meaning of "a," "an," and "the" includes plural reference, the meaning of "in" includes "in" and "on." Also, reference designators shown herein in parenthesis indicate components shown in a figure other than the one in discussion. For example, talking about a device (10) while discussing FIG. A would refer to an element, 10, shown in figure other than FIG. A.

Described herein is an assembly machine configured to deliver a receiving component to an assembler having a moveable coupling mechanism. The moveable coupling mechanism, which couples attaching components to the receiving components, does so at a continuous periodic rate. A feeder is configured with multiple drive trains, each of which is capable of altering its speed along a drive train path. The drive trains have transporting mechanisms coupled thereto. The transporting mechanisms cause the receiving components to move along the feeder to the assembler. In one embodiment, the drive trains, and thus the attached transporting mechanisms, alter speed along the drive train path so as to deliver the receiving components to the assembler such that the assembler may operate continuously without stopping between the delivery of a first receiving component or components and the delivery of a second receiving component or components. As such, the assembly machine of the present invention, using the feeder with multiple drive trains, each capable of altering its speed individually, operates more efficiently than prior art assembly machines. Experimental testing has shown the assembly machine of the present invention to increase throughput as much as 50% over prior art machines.

Throughout this disclosure, assembly of partitions will be set forth as one exemplary application for an assembly machine in accordance with the invention. This example is used for simplicity and clarity in explanation. Further, experimental testing has shown that an assembly machine in accordance with the invention is well suited for such an application. It will be clear to those of ordinary skill in the art having the benefit of this disclosure, however, that embodiments of the present invention are not limited to such applications. The invention may be applied to a wide variety of assembly applications where components are coupled together or where an insertion step occurs. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

Turning now to FIG. 1, illustrated therein is one embodiment of a semi-assembled partition 100 suitable for assembly by an assembling machine in accordance with the invention.

This exemplary partition 100 may be referred to as a "two by three" partition or a "three by four cell" partition. The partition 100 includes two receiving components 101,102, which are akin to the vertical components mentioned above, as they appear vertical when the partition 100 is viewed in cross section. The receiving components 101,102 are on the bottom of the partition 100, and include various notches, e.g. 106, suitable for receiving other components.

The partition 100 includes three attaching components 103,104,105, which comprise the horizontal components mentioned above, as they appear to be horizontal when the partition 100 is viewed in cross section. Each attaching component 103,104,105 includes a notch or recess, e.g. 107, suitable for coupling to other components. During assembly, for example, notch 106 of receiving component 101 engages notch 107 of attaching component 103. The other notches do so likewise, thereby forming the tic-tac-toe cross section commonly associated with the partition 100.

Figure 2:
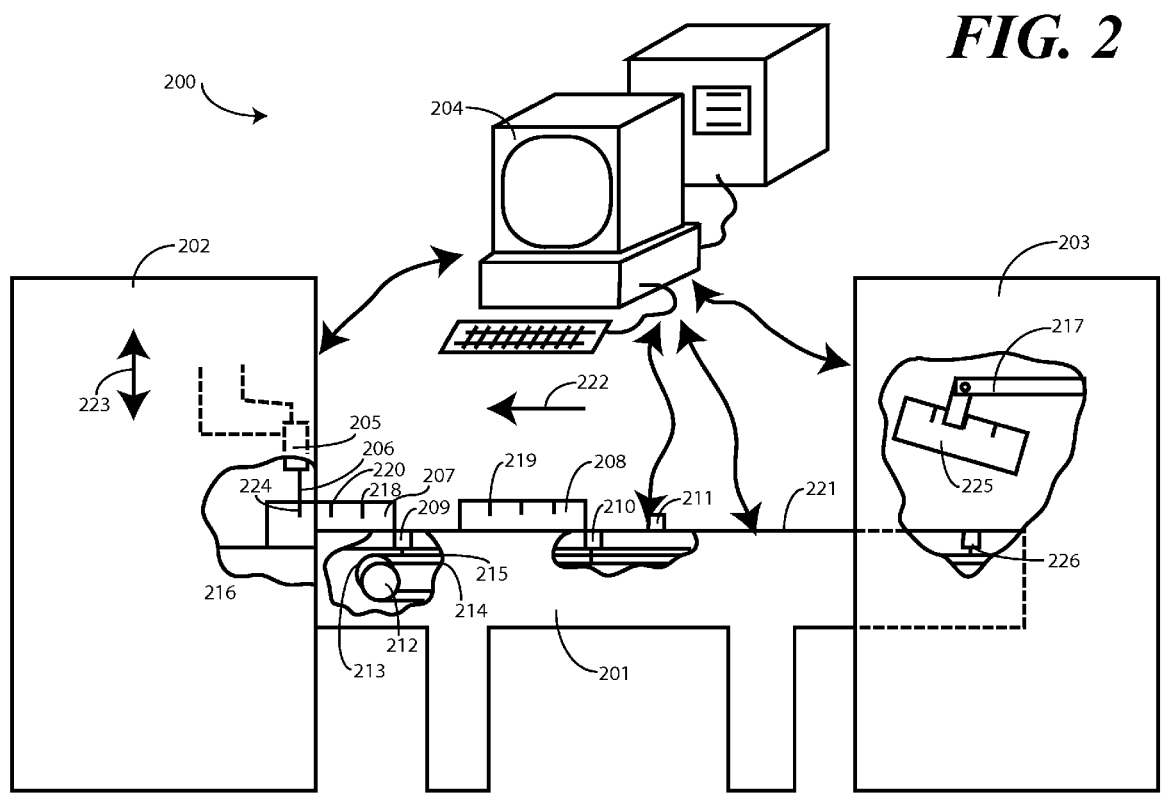
FIG. 2 illustrates a general view of one embodiment of an assembly machine in accordance with the invention.

Turning now to FIG. 2, illustrated therein is one embodiment of an assembly machine 200 in accordance with the invention. The assembly machine 200 includes a feeder 201 configured to deliver receiving components 207,208 (or groups of receiving components) to an assembler 202. The assembler 202 is configured to couple an attaching component 206 to the receiving components 207, 208 by way of a moveable coupling mechanism 205. The moveable coupling mechanism 205 moves reciprocally in a periodic motion while the receiving components 207,208 pass beneath. When a particular notch 224 is aligned with the attaching component 206, the moveable coupling mechanism 205 couples the attaching component 206 with the receiving components 207.

In prior art systems, there is a time delay between delivery of receiving component 207 and delivery of receiving component 208. Thus, the moveable coupling mechanism 205 must pause between the last notch 218 of the first receiving component 207 exiting the assembler 202 on conveyer belt 216 and the first notch 219 of the second receiving component 208 being delivered to the assembler 202. This pause or stoppage reduces throughput and efficiency.

With the present invention, by contrast, the feeder 201 includes a plurality of drive trains 212,213. Each drive train 212,213 includes at least one transporting mechanism coupled thereto. For instance, transporting mechanism 209 is coupled to drive train 213, while transporting mechanism 210 is coupled to drive train 212. The transporting mechanisms 212,213 are configured to feed the receiving components 207,208 into the assembler 202, beneath the moveable coupling mechanism 205, and onto conveyer belt 216.

In accordance with one embodiment of the invention, the drive train speed of each drive train 212,213 changes such that the moveable coupling mechanism 205 may continue to operate reciprocally at a constant, periodic coupling rate. In other words, the drive trains 212,213 alter speeds along the respective drive train loop so as to deliver the notches 217,218,219 of the receiving components 207,208 to the assembler 202 at a constant rate. This constant rate allows the moveable coupling mechanism 205 to reciprocate continually and evenly at a constant rate. On the upstroke the moveable coupling mechanism 205 retrieves an attaching component 206. On the down stroke, the moveable coupling mechanism 205 inserts the attaching component 206 into a notch of a receiving component. In the exemplary FIG. 2, drive train 212 accelerates at specific moments so as to deliver notch 219 to the assembler 202 after notch 218, in the same elapsed time that transpires between the delivery of notch 220 and notch 219. Said differently, the drive train speed associated with one of the plurality of drive trains, i.e. the drive train speed of drive train 212, changes such that the periodic coupling rate of the moveable coupling mechanism 205 remains constant between attachment of a first attaching component with a first receiving component, i.e. the attaching component coupled to notch 218 of receiving component 207, and attachment of a second attaching component with a second receiving component, i.e. the attaching component coupled to notch 219 of receiving component 208. This periodic coupling rate of attaching components to receiving components will be shown in more detail in the discussion of FIGS. 4-6 below.

As noted above, the exemplary application set forth in FIG. 2 is that of a partition-assembling machine where attaching components are inserted into receiving components. In such an application, the assembler 202 effectively becomes an insertion assembly, as the attaching components are "inserted" into the notches of the receiving components. Thus, the attaching component, e.g. 206, may also be referred to as an inserting component. Where the assembly machine 200 is configured to construct partitions like those shown in FIG. 1, a multi-celled partition, the insertion assembly is configured to insert a plurality of inserting components into one or more receiving components.

The feeder 201 includes a feeder table 221 configured to deliver one or more receiving components 207,208 to the assembler 202. The feeder 201 includes a feeder table 221 employing at least two drive trains 212,213 to accomplish the delivery. The drive trains 212,213 each have one or more transporting mechanisms 209,210,226 coupled thereto. For example, drive train 212 is coupled to transporting mechanism 210, while drive train 213 is coupled to transporting mechanism 209. When the drive trains 212,213 move, so do the transporting mechanisms 209,210, thereby delivering the receiving components 207,208 to the assembler.

In one embodiment, the drive trains 212,213 employ a pair of chain driven loops 214,215 to move the transporting mechanisms 209,210. For example, drive train 212 employs chain 214, while drive train 213 employs chain 215. Transporting mechanism 209, being coupled to chain 215, moves when drive train 213 moves chain 215. Correspondingly, transporting mechanism 210, being coupled to chain 214, moves when drive train 212 moves chain 214.

In viewing FIG. 2, the receiving components 207,208 move right to left, flowing from the delivery module 203 to the assembler 202. The moveable coupling mechanism 205 moves vertically in a reciprocating motion so as to insert the attaching components, e.g. 206, into the receiving components 207,208. Thus, the feeder 201 feeds the receiving components 207,208 into the assembler 202 in a first direction 222. The moveable coupling mechanism 205 moves in a second direction 223, which intersects the first direction, thereby enabling the attachment or insertion.

As the receiving components 207,208 include a plurality of notches, e.g. 224, they may be thought of as graduated components, where the notches serve as the graduations. When, for example, transporting mechanism 209 causes the "graduated" receiving component 207 to pass along one side of the feeder table 221 into the assembler 202, it must do so with a stair-stepped speed. In other words, transporting mechanism 209 pauses momentarily while the moveable coupling mechanism 205 inserts attaching component 206 into notch 224. The transporting mechanism 209 then moves so as to cause notch 220 to align with the moveable coupling mechanism 205. The transporting mechanism 209 then pauses again while another attaching component is inserted. This stair-stepped action continues until attaching components have been inserted into each of the notches 217,220,218 of receiving component 207.

At this time, transporting mechanism 210 accelerates to ensure that notch 219 is aligned with the moveable coupling mechanism 205 on by its next downward pass in its periodic coupling rate. Transporting mechanism 210 then enters a stair-stepped speed while attaching components are being inserted into the notches, e.g. 219, of receiving component 208.

Once the receiving components have been delivered to the assembler, the transporting mechanisms 209,210 may then move at a faster speed to return to the delivery module 203. In the delivery module 203, the transporting mechanisms 209, 210 receive new receiving components 225. For instance, delivery mechanism 217 delivers receiving component 225 to the feeder table 221 such that it may be delivered to the assembler 202 by transporting mechanism 226.

In one embodiment of the invention, each of the drive trains 212,213 has at least two transporting mechanisms coupled thereto. By way of example, drive train 213 has both transporting mechanism 209 and transporting mechanism 226 coupled to its drive train chain 215. Thus, while transporting mechanism 209 is delivering receiving component 207 to the assembler 202, transporting mechanism 226 is nearly in position to accept receiving component 225.

Coordination of the multiple drive trains 212,213, as well as control over the varying speed of each drive train chain 214,215, in one embodiment is coordinated with a computer 204. The computer 204 receives input from each of the components, including the assembler 202, the feeder 201, and the delivery module 203. For instance, the feeder 201 includes a transporting mechanism detector 211 that is capable of determining the position of the transporting mechanisms 209,210, 226 at least once along its corresponding drive train loop. In one embodiment, where the transporting mechanisms are manufactured from rigid metal as rigid arms coupling the pair of variable speed servo driven drive trains 212,213 for example, the transporting mechanism detector may be a magnetic or optical sensor capable of determining when the transporting mechanism is passing beneath.

Figure 7:
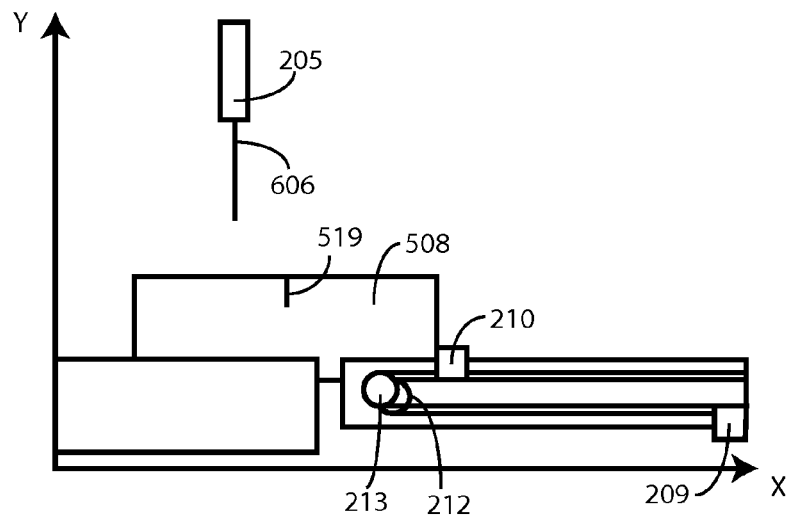

Similarly, as will be shown in more detail in the discussion of FIG. 7, each of the drive trains 212,213, as well as the moveable coupling mechanism 205 and the delivery mechanism 217, is driven by a variable speed servo. Variable speed servo devices include communication systems capable of telling computer 204 in exactly what position they are in radially. Where computer 204 is programmed with the distance between the transporting mechanism detector 211 and the moveable coupling mechanism 205, and where computer 204 is able to determine the positions of the servos driving the drive trains 212,213, the moveable coupling mechanism 205 and the delivery mechanism 217, the computer 204 may serve as a calibration device. As a calibration device, the computer 204 ensures that the notches of the receiving modules are delivered at appropriate times to the moveable coupling mechanism 205 so as to allow the moveable coupling mechanism to move at its continuous, periodic rate. Specifically, the computer 204 can adjust the drive train speed of drive train 212 so as to minimize the distance between components driven by the second transporting mechanism coupled to the second drive train, i.e. receiving component 208 driven by transporting mechanism 210 coupled to drive train 212, and the first transporting mechanism coupled to the first drive train, i.e. transporting mechanism 209 coupled to drive train 213. This minimization of distance, which occurs when both the first transporting mechanism and the second transporting mechanism are transporting receiving components, allows notch 219 to align with the moveable coupling mechanism 205 after notch 218 without altering the periodic coupling rate of the moveable coupling mechanism 205.

Figure 3:
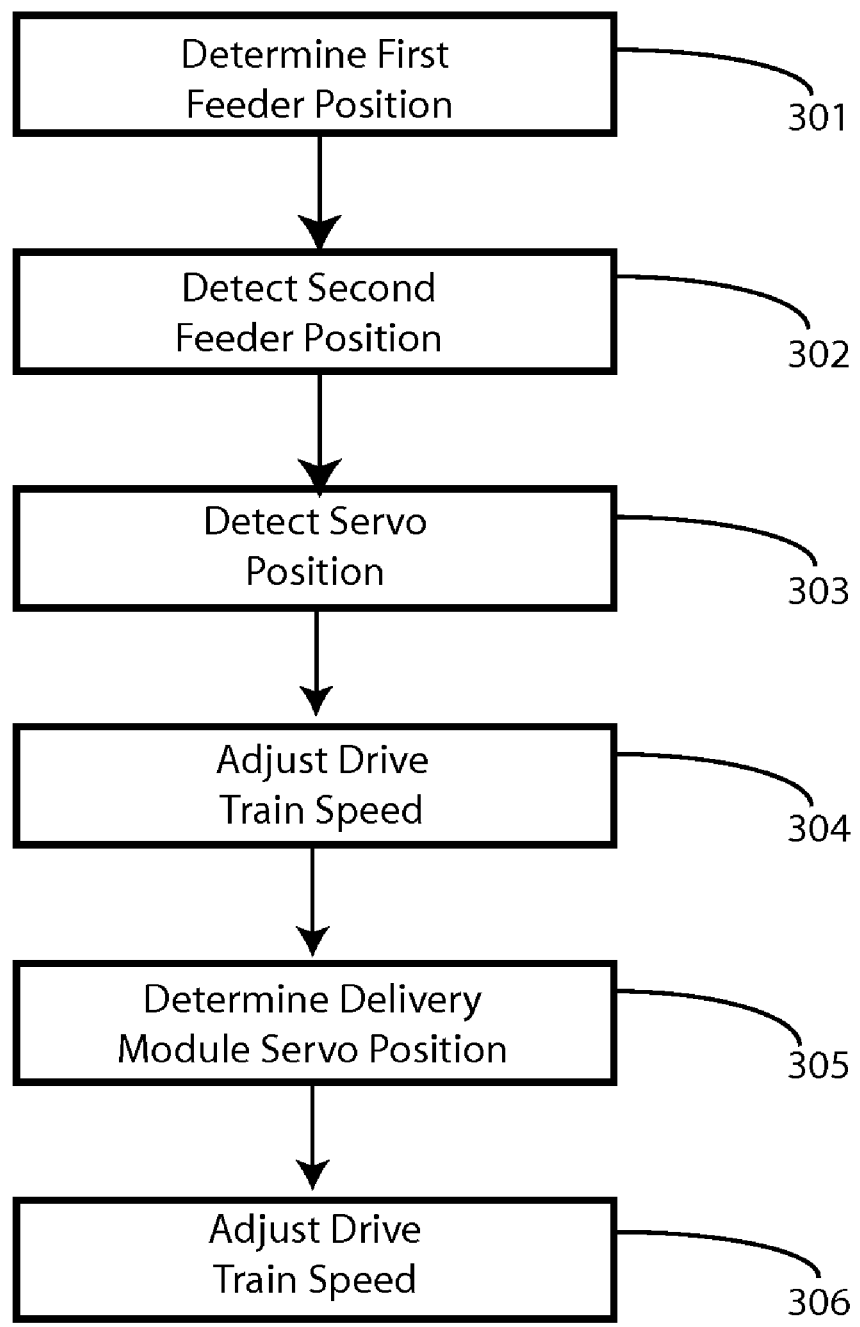
FIG. 3 illustrates one embodiment of a method executed by a calibration device in accordance with the invention.

Turning now to FIG. 3, illustrated therein is one such method that the computer (204) may execute when operating as a calibration device. The method, which may be embodied as computer useable instructions in the form of software code, facilitates a drive train loop and moveable coupling mechanism action that recurs repeatedly without error or tolerance build up.

At step 301, the computer (204) determines a first feeder position of the first transporting mechanism (209), which is coupled to the first drive train, i.e. drive train 213. The computer (204) does this by determining how far the servo driving drive train 213 has rotated since the first transporting mechanism (transporting mechanism 209) passed beneath the transporting mechanism detector (211). With knowledge of the gear ratios associated with drive train 213, the computer executes a simple calculation to determine the position of transporting mechanism 210.

At step 302, the computer (204) detects a second feeder position of the second transporting mechanism (transporting mechanism 210), which is coupled to the second drive train (drive train 212). The computer (204) accomplishes this by sensing transporting mechanism 210 as it passes under the transporting mechanism detector (211).

At step 303, the computer (204) detects the servo position of the servo driven moveable coupling mechanism (205), which is moving at a constant periodic coupling rate. This detection allows the computer to determine where along the reciprocating stroke the moveable coupling mechanism (205) happens to be.

At step 304, after executing steps 301,302,303, the computer (204) adjusts the drive train speed of the second drive train (drive train 212) such that the distance between the first transporting mechanism (209) and components driven by the second transporting mechanism (210) is minimized prior to delivery of the components driven by the second transporting mechanism (210) to the moveable coupling mechanism (205). This process is known as "queuing", and allows the elapsed time between a penultimate notch and a last notch in a particular receiving component passing under the moveable coupling mechanism (205) to be the same as the elapsed time between the last notch in one receiving component and the first notch of another receiving component passing under the moveable coupling mechanism (205). In prior art systems, where receiving components were evenly spaced along a feeder, this was not possible. In the present invention however, after minimizing the distance, the computer (204) is able to adjust the drive train speed of the second drive train loop (drive train 212) such that the coupling regions (224,220,218) on receiving components (207) driven by the first transporting mechanism (209) and coupling regions (e.g. 219) on receiving components (208) driven by the second transporting mechanism (210) are delivered to the servo driven moveable coupling mechanism (205) at a constant rate.

At step 305, the computer (204) determines a delivery position of the servo driven moveable delivery mechanism (217). The computer (204) does this by detecting the position of the servo driving the delivery mechanism (217). Once this is known, the computer (204) may adjust the drive train speed of, for example, the first drive train loop (drive train 213) such that a drive train transporting mechanism (transporting mechanism 226) engages a receiving component (225) when delivered by the moveable delivery mechanism (217) at step 306.

Figure 4:
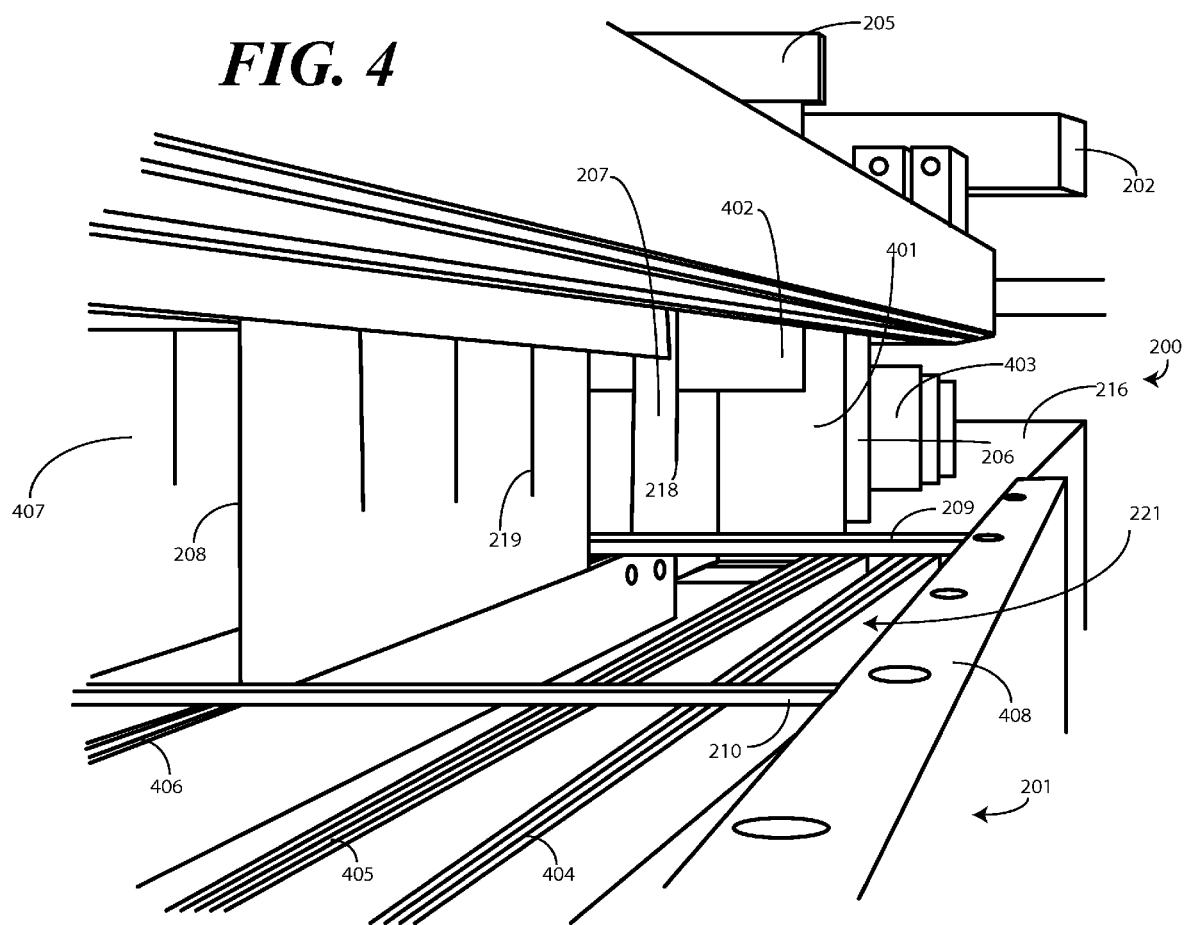
FIG. 4 illustrates a perspective view of partitions being assembled with an assembly machine in accordance with the invention.

Turning now to FIG. 4, illustrated therein is a perspective view of one embodiment of an assembly machine 200 in accordance with the invention. As shown in FIG. 2, the feeder 201 delivers receiving components 207,208 to the assembler 202 for assembly. Specifically, transporting mechanism 209 delivers receiving member 207, which in some applications may include a plurality of receiving members, to the assembler 202 so that the moveable coupling mechanism 205 may insert attaching members 206,401,402 into receiving member 207, thereby constructing a multi-celled partition. Similarly, transporting mechanism 210 feeds receiving members 208, 407 to the assembler 202. When notch 219 is aligned with the moveable coupling mechanism 205, attaching members will be inserted. Completed partitions 403 are then swept away by the conveyor belt 216.

The feeder table 221 is more visible in the perspective view of FIG. 4 than in the side view of FIG. 2. As can be seen in FIG. 4, the feeder table 221 includes a plurality of receiving component guides 404,405,406. These receiving component guides 404,405,406, in one embodiment, are rigid slots that run the length of the feeder table 221. Where the assembly machine 200 of the present invention is used in applications such as partition construction, the receiving component guides 404,405,406 allow the receiving components 208,407 to move along the feeder table 221 in an upright position.

In the exemplary embodiment of FIG. 4, the transporting mechanisms 209,210 are disposed substantially perpendicularly to the plurality of receiving component guides 404,405, 406. This perpendicular alignment allows a single transporting mechanism 210 to move a plurality of receiving components, e.g. 208,407, along the plurality of receiving component guides 404,405,406 at the drive train speed. In this exemplary embodiment, the transporting mechanisms 209, 210 are rigid arms spanning and coupling the chains of their respective drive trains. Note that in FIG. 4 drive train cover 408 covers the drive trains, which in one embodiment are variable speed servo driven chains coupled to the transporting mechanisms 209,210.

Figure 5:
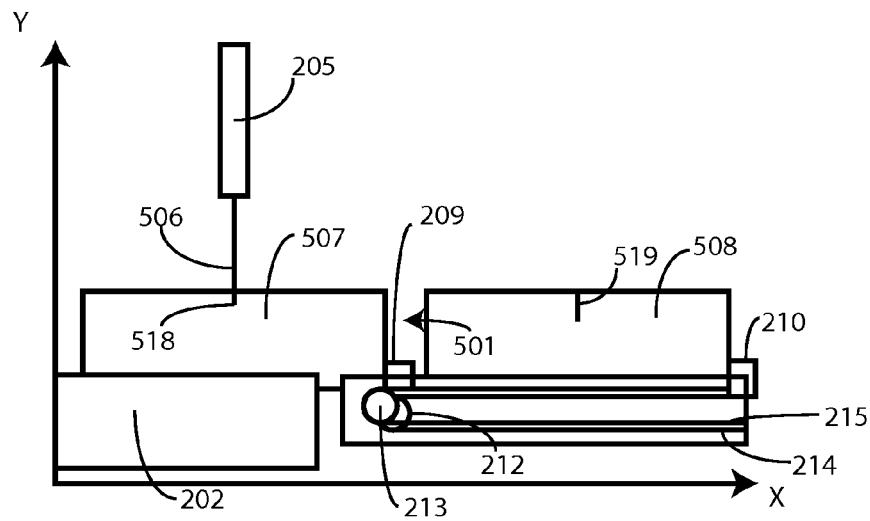
FIGS. 5-7 illustrate time-lapse views of partitions being assembled with an assembly machine in accordance with the invention.
Figure 6:
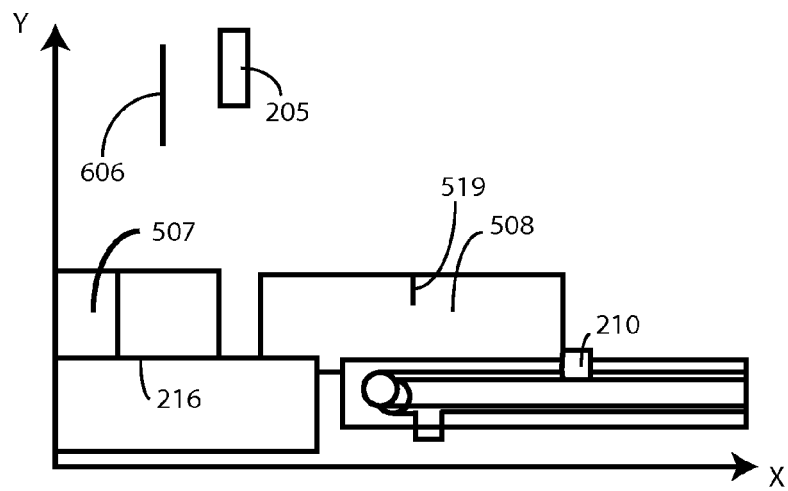

Turning now to FIGS. 5, 6 and 7, illustrated therein are time-lapse side views of the motion of the drive trains 212, 213, the transporting mechanisms 209,210, and the receiving members 507,508. For simplicity, FIGS. 5, 6, and 7 illustrate receiving members 207,208 having a single notch 518,519. However, as shown in FIG. 1, many applications will include receiving members having a plurality of notches. The single notch example is to be used for illustration purposes, as it will be clear to those of ordinary skill in the art having the benefit of this disclosure that the invention is not to be limited by the illustrations of FIGS. 5, 6, and 7.

Each of the drive trains 212,213 has at least one transporting mechanism 209,210 coupled thereto. For example, drive train 212 is coupled to transporting mechanism 210, while drive train 213 is coupled to transporting mechanism 209. In one embodiment of the invention shown to work well in experimental testing, each drive train 212,213 has at least two transporting mechanisms coupled thereto, with each of the transporting mechanisms being disposed at substantially equidistant intervals along the drive trains. (In one embodiment two transporting mechanisms per drive train are employed.) Also, in one embodiment the transporting mechanisms 209,210 are coupled to the drive trains 212,213 in a variable speed servo driven loop, with chain 214 and chain 215 serving as the loops. Thus, the drive trains 212,213 may be a pair of chain driven loops having two transporting mechanisms coupled thereto.

At FIG. 5, transporting mechanism 209 delivers receiving component 507 to the assembler 202. Moveable coupling mechanism 205 inserts attaching component 506 to receiving component 507 at notch 518. During this time, drive train 213, and thus transporting mechanism 209, moves in a first drive train motion that is stair-stepped and intermittent. The stair-stepped motion continues until the moveable coupling mechanism 205 has inserted attaching components into each notch. Drive train 213 pauses while moveable coupling mechanism 205 inserts the attaching component 506, and then moves quickly to align the next notch with the moveable coupling mechanism 205.

While this occurs, drive train 212 moves in a second drive train motion having a first speed. This first speed allows transporting mechanism 210 to cause receiving component 508 to catch up to transporting mechanism 209. Drive train 212 adjusts to the first speed such that the distance 501 between the first transporting mechanism, transporting mechanism 209, and components driven by the second transporting mechanism, i.e. receiving component 508 driven by transporting mechanism 210, is minimized prior to the delivery of the receiving component 508 to the assembler 202 and the moveable coupling mechanism 205. This minimization allows the moveable coupling mechanism 205 to operate at a continuous periodic rate even though multiple receiving mechanisms 507,508 pass beneath. In other words, the drive train 212 changes its drive train speed such that the periodic coupling rate of the moveable coupling mechanism 205 remains constant between the attachment of a first attaching component 506 with a first receiving component and the attachment of a second attaching component (element 606 in FIG. 6 below) with the second receiving component 508.

At FIG. 6, receiving component 507 has received attaching components for each notch, and is then swept away by conveyor belt 216. Moveable coupling mechanism 205 is now on its upstroke to retrieve another attaching component, attaching component 606. Since the distance between the final attaching component (506) coupled to receiving component 508 and the initial attaching component 606 being coupled to receiving component 508 is generally greater than the distance between notches in a single receiving component, to permit the moveable coupling mechanism 205 to operate at its periodic rate, transporting mechanism 210 must accelerate in FIG. 6. Specifically, transporting mechanism 210 must change to a third drive train motion having a second speed that is fast enough to align notch 519 with the moveable coupling mechanism 205 prior to it inserting attaching component 606 to receiving component 508. (Note that where receiving components 507 and 508 include a plurality of notches, attaching component (506) is the final attaching component of a first plurality of attaching components to be attached to receiving component 507. Similarly, attaching component 606 would be the initial attaching component of a second plurality of attaching components.)

At FIG. 7, transporting mechanism 210 is moving receiving component 508 such that notch 519 will be aligned with the moveable coupling mechanism 205. Moveable coupling mechanism 205 has retrieved attaching component 606 and will insert it into notch 519 at the base of the down stroke. During this time, drive train 212, and thus transporting mechanism 210 alternates from the third drive train motion at the second speed to the first drive train motion at the stair-stepped, intermittent speed. This first motion continues so long as attaching components are to be inserted into the notches of receiving component 508. Note that drive train 213 is now free to accelerate to permit transporting mechanism 209 to return to the delivery module to retrieve another receiving component.

Figure 8:
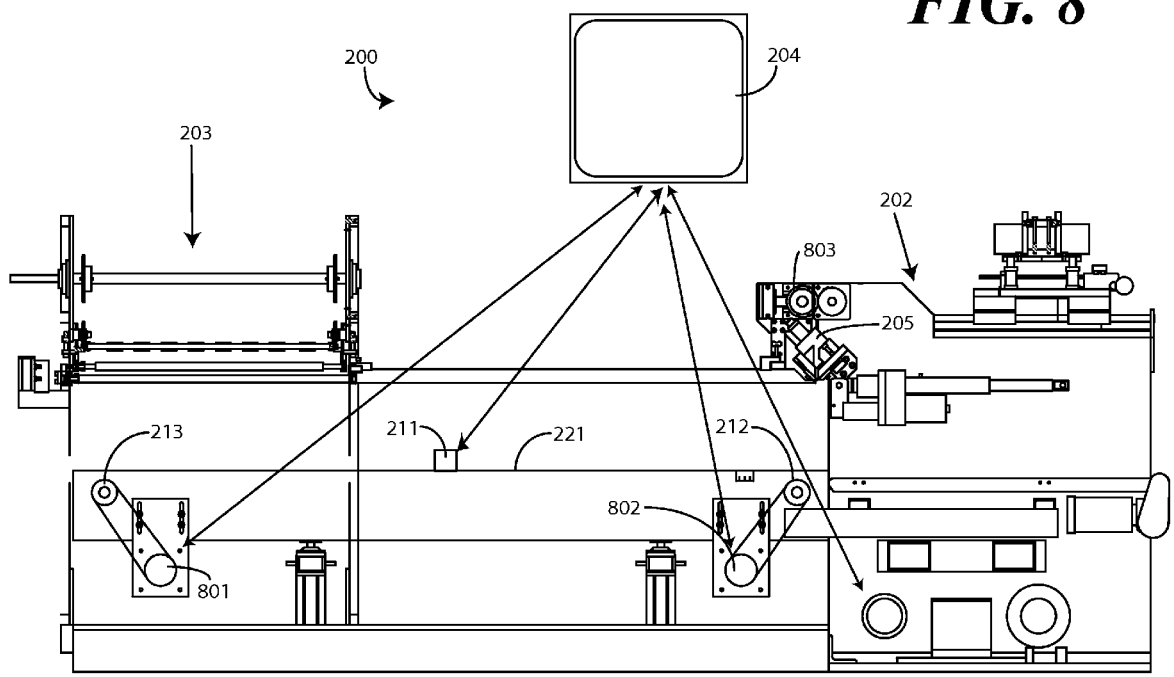
FIG. 8 illustrates an elevation side view of one embodiment of an assembly machine in accordance with the invention.

Turning now to FIG. 8, illustrated therein is a more detailed side, elevation view of one embodiment of an assembly machine 200 in accordance with the invention. From this view, details of the feeder 201, the assembler 202, and the delivery module 203 can be seen.

As noted above, in one embodiment of the invention, each of the plurality of drive trains 212,213 comprises a variable speed servo driven loop. In FIG. 8, the variable speed servos 801,802 can more clearly be seen. These variable speed servos 801,802 allow the drive train speed associated with either drive train 212,213 to change such that receiving components are delivered to the assembler 202 with a periodic coupling rate of the moveable coupling mechanism 205 remaining constant.

As with the drive trains, the moveable coupling mechanism 205 is also driven by a servo. Specifically, moveable coupling mechanism 205 is driven by a moveable coupling mechanism servo 803 coupled to and capable of actuating the moveable coupling mechanism 205. As with the servos driving the drive trains, the moveable coupling mechanism servo 803 includes circuitry that acts as a moveable coupling mechanism servo detector to deliver the precise servo positions to the computer 204. Thus, the computer 204 is able to continually determine the moveable coupling mechanism servo position.

The computer 204 is in communication with the transporting mechanism detector 211, the variable speed servo 801 driving drive train 213, the variable speed servo 802 driving drive train 212, and the moveable coupling mechanism servo 803. From the transporting mechanism detector 211, the computer 204 is able to detect the position of the transporting mechanisms. From the position of the variable speed servos 801,802, with knowledge of the length of the feeder table, the computer may determine the feeder position of any of the transporting mechanisms. From the moveable coupling mechanism servo 803 and its moveable coupling mechanism servo detector, the computer 204 is able to detect the position of the moveable coupling mechanism 205. Once all of this is determined or detected, the computer 204 is able to alter the speeds of the variable speed servos 801,802 so as to alter the speed of the drive trains 212,213 and thus the drive train loops. In so doing the computer 204 may alter, for example, the drive train speed of a second drive train loop such that the distance between a first transporting mechanism coupled to the first drive train loop and components being driven by the second transporting mechanism is minimized prior to the delivery of the components driven by the second transporting mechanism to the assembler 202. In short, by detecting this information, the computer 204 is capable of queueing components.

The computer 204 may also alter the drive train speed when serving as the calibration device. Where the computer 204 does so to enable the moveable coupling mechanism to operate at a continuous periodic rate from receiving component to receiving component, the computer 204 varies the drive train speed such that notches, or coupling regions, on components driven by a first drive train and notches on components driven by a second drive train exit the feeder table 221 at a constant rate.

Figure 9:
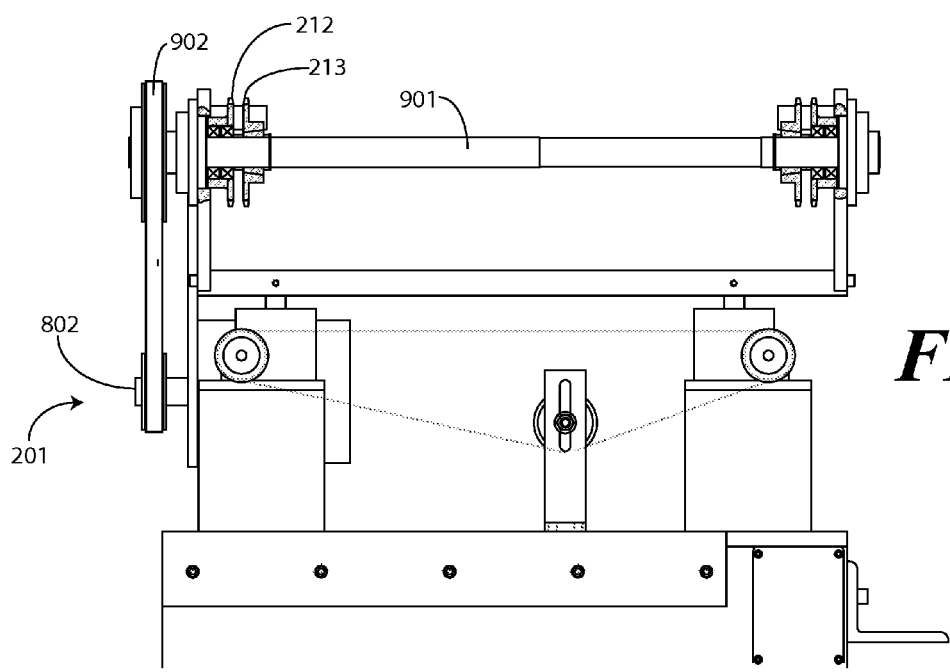
FIG. 9 illustrates a front elevation view of one embodiment of a drive train assembly in accordance with the invention.
Figure 10:
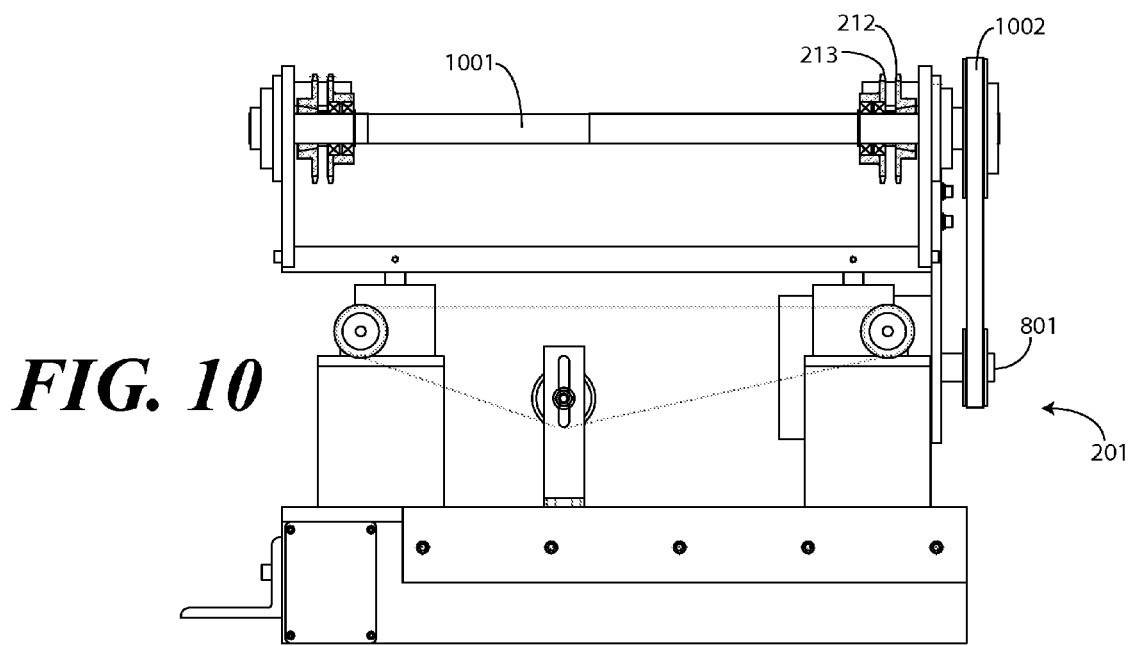
FIG. 10 illustrates a rear elevation view of one embodiment of a drive train assembly in accordance with the invention.

Turning now to FIGS. 9 and 10, illustrated therein are a front elevation view and a rear elevation view of a feeder 201 in accordance with the invention. From these views, the coupling of the drive trains to axles 901, 1001 can be seen. Drive train 212 is coupled to axle 901, while drive train 213 spins freely about axel 901. Conversely, drive train 213 is coupled to axle 1001, while drive train 212 spins freely about axle 1001. Belt 902 is coupled to variable speed servo 802, while belt 1002 is coupled to variable speed servo 801. By varying either variable speed servo 801, 802, the computer (204) can vary the speed of one drive train, drive train loop, drive train chain, and transporting mechanisms coupled thereto, without affecting the other's motion.

Figure 11:
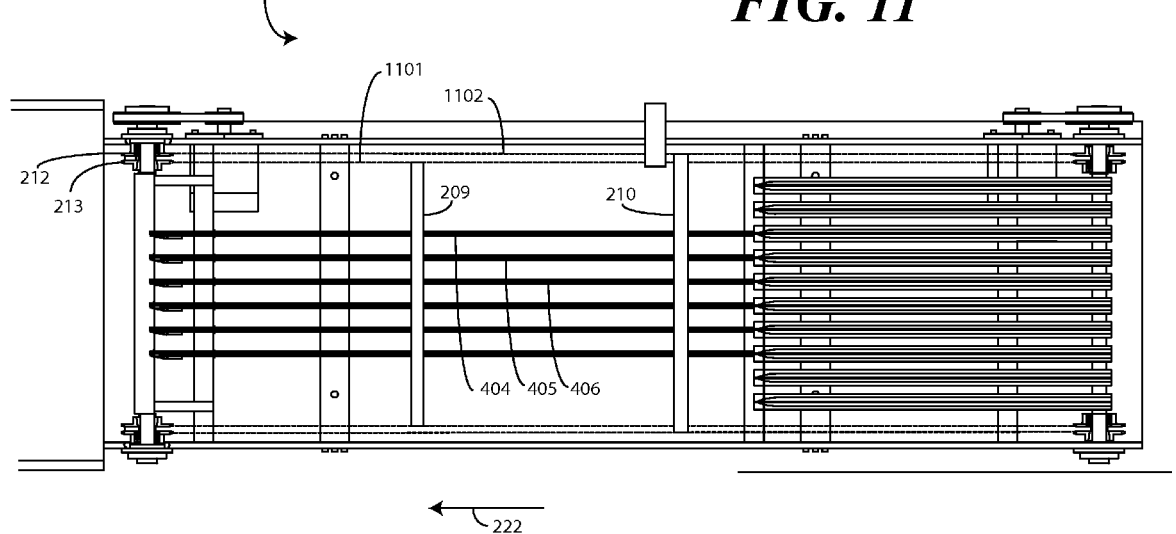
FIG. 11 illustrates a top plan view of one embodiment of a feeder table in accordance with the invention.

Turning now to FIG. 11, illustrated therein is a top, plan view of one embodiment of a feeder 201 in accordance with the invention. From this view, the receiving component guides 404,405,406 can more clearly be seen. Additionally, the drive trains 212,213 and their drive train chains 1101, 1102. Each drive train chain 1101,1102 has at least one transporting mechanism 209,210 coupled thereto. In FIG. 11, transporting mechanism 209 is coupled to drive train chain 1101 and drive train 213, while transporting mechanism 210 is coupled to drive train chain 1102 and drive train 212. The transporting mechanisms 209,210, and thus the drive trains 212,213 are interlaced such that the first transporting mechanism 209 is followed sequentially by the second transporting mechanism 210 when the drive train chains 1101,1102 are in motion.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. Accordingly, the specification and figures are to be regarded in an illustrative rather than a restrictive sense, and all such modifications are intended to be included within the scope of present invention.

What is claimed is:

1. A method of controlling delivery of components to an assembler, the method comprising:
   determining a first feeder position of a first transporting mechanism coupled to a first drive train;
   detecting a second feeder position of a second transporting mechanism coupled to a second drive train;
   detecting a servo position of a servo driven moveable coupling mechanism moving reciprocally at a constant periodic coupling rate; and
   adjusting a drive train speed of the second drive train loop such that a distance between the first transporting mechanism and components driven by the second transporting mechanism is minimized prior to delivery of the components driven by the second transporting mechanism to the servo driven moveable coupling mechanism.

2. The method of claim 1, further comprising determining a delivery position of a servo driven moveable delivery mechanism and adjusting a drive train speed of the first drive train such that the first transporting mechanism engages a component when delivered by the servo driven moveable delivery mechanism.

3. The method of claim 2, wherein the determining the delivery position comprises detecting a position of a servo driving a delivery mechanism.

4. The method of claim 1, wherein the components driven by both the first transporting mechanism and the second transporting mechanism comprise a plurality of coupling regions, further comprising adjusting the drive train speed of the second drive train such that coupling regions on components driven by the first transporting mechanism and coupling regions on components driven by the second transporting mechanism are delivered to the servo driven moveable coupling mechanism at a constant rate.

5. The method of claim 1, wherein the determining the first feeder position comprises determining how far a servo has rotated since the first transporting mechanism passed beneath a transporting mechanism detector.

6. The method of claim 1, wherein the determining the second feeder position comprises sensing the second transporting mechanism as it passes under a transporting mechanism detector.

7. The method of claim 1, wherein the detecting the servo position comprises determining a location of the servo driven moveable coupling mechanism along a servo reciprocating stroke.

8. The method of claim 1, wherein the adjusting the drive train speed comprises causing an elapsed time during which a penultimate notch and a last notch in an attaching component moved by the first transporting mechanism passes beneath the servo driven moveable coupling mechanism to be equivalent to another elapsed time during which the last notch in the attaching component and a first notch in another attaching component driven by the second transporting mechanism passes beneath the servo driven moveable coupling mechanism.

9. The method of claim 1, wherein the servo driven moveable coupling mechanism moves reciprocally in a periodic motion.

10. The method of claim 9, wherein the adjusting comprises permitting the servo driven moveable coupling mechanism to continue to move reciprocally in the periodic motion.

11. The method of claim 1, wherein the adjusting comprises delivering notches of the first transporting mechanism and the second transporting mechanism to the assembler at a constant rate.

12. A method of controlling delivery of components to an assembler, comprising:
   determining a first feeder position of a first transporting mechanism coupled to a first drive train;
   detecting a second feeder position of a second transporting mechanism coupled to a second drive train;
   detecting a servo position of a servo driven moveable coupling mechanism moving reciprocally at a constant periodic coupling rate;
   adjusting a drive train speed of the second drive train such that a distance between the first transporting mechanism and components driven by the second transporting mechanism is minimized prior to delivery of the components driven by the second transporting mechanism to the servo driven moveable coupling mechanism; and
   determining a delivery position of a servo driven moveable delivery mechanism.

13. The method of claim 12, further comprising adjusting a drive train speed of the first drive train such that the first transporting mechanism engages a component when delivered by the servo driven moveable delivery mechanism and detecting a position of a servo.

14. The method of claim 12, wherein the components driven by both the first transporting mechanism and the second transporting mechanism comprise a plurality of coupling regions, further comprising adjusting the drive train speed of the second drive train such that coupling regions on components driven by the first transporting mechanism and coupling regions on components driven by the second transporting mechanism are delivered to the servo driven moveable coupling mechanism at a constant rate.

15. The method of claim 12, wherein the determining the first feeder position comprises determining how far a servo has rotated since the first transporting mechanism passed beneath a transporting mechanism detector.

16. The method of claim 12, wherein the determining the second feeder position comprises sensing the second transporting mechanism as it passes under a transporting mechanism detector.

17. The method of claim 12, wherein the detecting the servo position comprises determining a location of the servo driven moveable coupling mechanism along a servo reciprocating stroke.

18. The method of claim 12, wherein the adjusting the drive train speed comprises causing an elapsed time during which a penultimate notch and a last notch in an attaching component moved by the first transporting mechanism passes beneath the servo driven moveable coupling mechanism to be equivalent to another elapsed time during which the last notch in the attaching component and a first notch in another attaching component driven by the second transporting mechanism passes beneath the servo driven moveable coupling mechanism.

19. A method of controlling delivery of components to an assembler, comprising:
   determining a first feeder position of a first transporting mechanism coupled to a first drive train;
   detecting a second feeder position of a second transporting mechanism coupled to a second drive train;

detecting a servo position of a servo driven moveable coupling mechanism moving reciprocally at a constant periodic coupling rate;

adjusting a drive train speed of the second drive train such that a distance between the first transporting mechanism and components driven by the second transporting mechanism is minimized prior to delivery of the components driven by the second transporting mechanism to the servo driven moveable coupling mechanism; and adjusting a drive train speed of the first drive train such that the first transporting mechanism engages a component when delivered by a servo driven moveable delivery mechanism.

20. The method of claim 19, further comprising determining a delivery position of the servo driven moveable delivery mechanism and detecting a position of a delivery mechanism.

* * * * *